(12) United States Patent
Kim et al.

(10) Patent No.: US 10,529,407 B2
(45) Date of Patent: Jan. 7, 2020

(54) MEMORY DEVICE INCLUDING A PLURALITY OF POWER RAILS AND METHOD OF OPERATING THE SAME

(71) Applicant: SAMSUNG ELECTRONICS CO., LTD., Suwon-si, Gyeonggi-do (KR)

(72) Inventors: Young-Hwa Kim, Seongnam-si (KR); Tae-Young Oh, Seoul (KR); Jin-Hun Jang, Uiwang-si (KR); Seok-Jin Cho, Taipei (TW); Kyung-Soo Ha, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/039,400

(22) Filed: Jul. 19, 2018

(65) Prior Publication Data
US 2019/0027206 A1    Jan. 24, 2019

(30) Foreign Application Priority Data

Jul. 20, 2017  (KR) .......................... 10-2017-0092261
Jul. 6, 2018   (KR) .......................... 10-2018-0078936

(51) Int. Cl.
*G11C 5/14*     (2006.01)
*G11C 11/4074*  (2006.01)

(52) U.S. Cl.
CPC .......... *G11C 11/4074* (2013.01); *G11C 5/147* (2013.01)

(58) Field of Classification Search
CPC .................................. G11C 5/147; G11C 7/00
(Continued)

(56) References Cited

U.S. PATENT DOCUMENTS

| 5,886,561 A | 3/1999 | Eitan et al. |
| 7,782,701 B2 | 8/2010 | Seo et al. |

(Continued)

FOREIGN PATENT DOCUMENTS

| CN | 106873696 A | 6/2017 |
| KR | 100152354 B1 | 10/1998 |

(Continued)

OTHER PUBLICATIONS

Office Action From Singapore Patent Office Corresponding to Application SG 10201804015P, dated Feb. 19, 2019.

(Continued)

*Primary Examiner* — Michael T Tran
(74) *Attorney, Agent, or Firm* — Volentine, Whitt & Francos, PLLC

(57) ABSTRACT

A memory device has a plurality of power rails, including: a first power rail for transmitting a high power voltage, a second power rail for transmitting a low power voltage, a third power rail for selectively receiving the high power voltage from the first power rail through a first dynamic voltage and frequency scaling (DVFS) switch and for selectively receiving the low power voltage from the second power rail through a second DVFS switch, a fourth power rail connected to a first power gating (PG) switch to selectively receive the high power voltage or the low power voltage from the third power rail, and a first circuit block connected to the fourth power rail to receive a power voltage to which the DVFS and PG are applied. When power gating is applied, supply of the power voltage to the fourth power rail is blocked.

19 Claims, 8 Drawing Sheets

(58) Field of Classification Search
USPC .......................................... 365/226, 189.11
See application file for complete search history.

(56) References Cited

U.S. PATENT DOCUMENTS

| | | | |
|---|---|---|---|
| 8,415,972 B2 | 4/2013 | Rogers et al. | |
| 8,786,130 B1 | 7/2014 | Viori et al. | |
| 8,971,097 B2 | 3/2015 | Ngo et al. | |
| 9,001,572 B2 | 4/2015 | Choi et al. | |
| 9,337,660 B1 | 5/2016 | Bourstein | |
| 9,564,890 B2 | 2/2017 | Marschalkowski et al. | |
| 9,654,101 B2* | 5/2017 | Cao | H03K 19/0016 |
| 9,703,366 B2 | 7/2017 | Jeon | |
| 9,852,859 B2* | 12/2017 | Cao | H03K 19/0008 |
| 9,977,480 B2* | 5/2018 | Kolla | G06F 1/3234 |
| 10,050,448 B2* | 8/2018 | Kolla | H02J 4/00 |
| 2008/0018381 A1 | 1/2008 | Shin | |
| 2010/0244942 A1 | 9/2010 | Okano | |
| 2011/0161690 A1 | 6/2011 | Lin et al. | |
| 2012/0117391 A1 | 5/2012 | Jacquet et al. | |
| 2014/0264924 A1* | 9/2014 | Yu | H01L 23/5286 257/774 |
| 2014/0301259 A1 | 10/2014 | Homchaudhuri et al. | |
| 2014/0313819 A1* | 10/2014 | Choi | G11C 5/14 365/156 |
| 2015/0009751 A1 | 1/2015 | Kulkarni et al. | |
| 2015/0036446 A1 | 2/2015 | Kenkare et al. | |
| 2015/0041955 A1* | 2/2015 | Zerbe | H01L 23/49816 257/532 |
| 2015/0340073 A1 | 11/2015 | Seo et al. | |
| 2016/0013643 A1* | 1/2016 | Park | H02J 3/00 713/300 |
| 2016/0036434 A1 | 2/2016 | Hara et al. | |
| 2016/0071674 A1 | 3/2016 | Kitora et al. | |
| 2016/0094121 A1 | 3/2016 | Cowley et al. | |
| 2016/0111134 A1 | 4/2016 | Kim et al. | |
| 2016/0179164 A1* | 6/2016 | Park | G06F 1/324 713/322 |
| 2016/0266639 A1* | 9/2016 | Doering | G06F 1/26 |
| 2016/0306412 A1 | 10/2016 | Kolla et al. | |
| 2016/0313638 A1* | 10/2016 | Jung | G03F 1/68 |
| 2016/0320821 A1* | 11/2016 | Mair | G06F 1/3296 |
| 2016/0349827 A1 | 12/2016 | Idgunji et al. | |
| 2016/0360613 A1* | 12/2016 | Kho | H05K 1/11 |
| 2017/0018504 A1* | 1/2017 | Byun | H01L 23/5286 |
| 2017/0070225 A1* | 3/2017 | Kim | H03K 17/6871 |
| 2017/0075401 A1 | 3/2017 | Choi et al. | |
| 2017/0083067 A1* | 3/2017 | Ganor | G06F 1/26 |
| 2017/0141029 A1* | 5/2017 | Guo | H01L 23/5226 |
| 2017/0147053 A1 | 5/2017 | Chang et al. | |
| 2017/0147727 A1* | 5/2017 | Bickford | G06F 17/5045 |
| 2017/0169875 A1 | 6/2017 | Gans | |
| 2017/0177374 A1* | 6/2017 | Morning-Smith | G06F 1/263 |
| 2017/0194483 A1 | 7/2017 | Ng et al. | |
| 2017/0194957 A9 | 7/2017 | Simmonds | |
| 2017/0243637 A1 | 8/2017 | Kulkarni et al. | |
| 2017/0285676 A1* | 10/2017 | Sutton | G01R 17/00 |
| 2017/0337102 A1* | 11/2017 | Engler | G06F 12/00 |
| 2017/0346299 A1 | 11/2017 | Sridhar et al. | |
| 2017/0351315 A1* | 12/2017 | Ochoa Munoz | G06F 1/324 |
| 2018/0004276 A1* | 1/2018 | Wong | G06F 1/263 |
| 2018/0061854 A1* | 3/2018 | Ono | H01L 27/124 |
| 2018/0088649 A1* | 3/2018 | Cheung | G06F 1/28 |
| 2018/0095514 A1* | 4/2018 | Man | G06F 1/28 |
| 2018/0108611 A1* | 4/2018 | Wu | H01L 23/5286 |
| 2018/0159431 A1* | 6/2018 | Brunschwiler | H02M 3/158 |
| 2018/0182675 A1* | 6/2018 | Zeng | H01L 21/845 |
| 2018/0254732 A1* | 9/2018 | Smolenaers | H02J 7/022 |

FOREIGN PATENT DOCUMENTS

| | | |
|---|---|---|
| KR | 1020070109429 A | 11/2007 |
| WO | WO2017098211 A1 | 6/2017 |

OTHER PUBLICATIONS

Office Action From European Patent Office Corresponding to Application EP 18 18 4828.4, dated Mar. 8, 2019.
Office Action From European Patent Office Corresponding to Application EP 18 18 4829.2, dated Mar. 13, 2019.
Office Action From Intellectual Property Office of Singapore Related to Singapore Patent No. 10201806186U, dated May 30, 2019.

* cited by examiner

FIG. 5B
|  | SW_A | SW_B | SW_C | SW_D | SW_E |
|---|---|---|---|---|---|
| VDD2H only+PG=VPWR_2H | X | X | X | X | 1/0 |
| DVFS VINT=VDD2L | 1 | X | 0 | X | X |
| DVFS VINT=VDD2H | 0 | X | 1 | X | X |
| DVFS VPWR_INT=VDD2L+PG | 1 | 1/0 | 0 | 0 | X |
| DVFS VPWR_INT=VDD2H+PG | 0 | 1/0 | 1 | 1/0 | X |
FIG. 6A
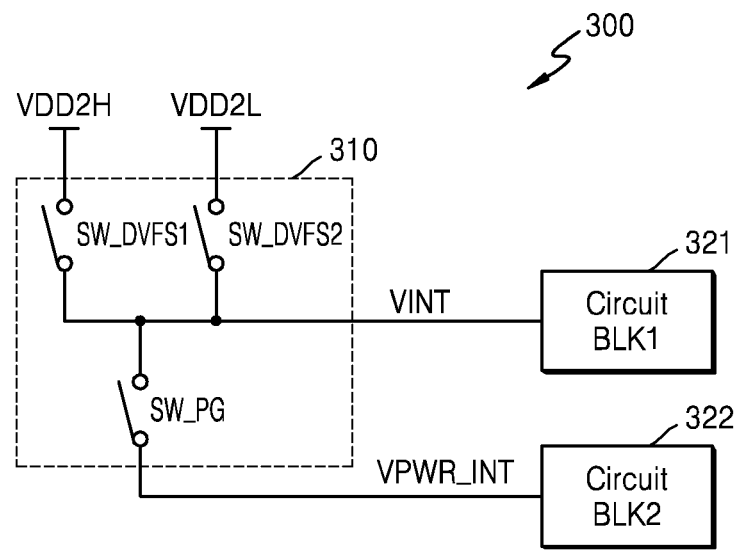
FIG. 6B
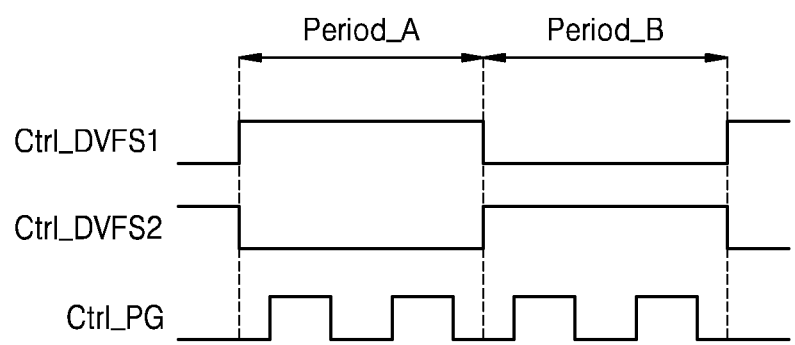

MEMORY DEVICE INCLUDING A PLURALITY OF POWER RAILS AND METHOD OF OPERATING THE SAME

CROSS-REFERENCE TO RELATED APPLICATION

This application claims the benefit of Korean Patent Application No. 10-2017-0092261, filed on Jul. 20, 2017, in the Korean Intellectual Property Office, the disclosure of which is incorporated herein in its entirety by reference.

BACKGROUND

The inventive concept relates to a memory device, and more particularly, to a memory device including a plurality of power rails and a method of operating the same.

The storage capacity and speed of a semiconductor memory device widely used in a high performance electronic system are increasing. As an example of the semiconductor memory device, dynamic random access memory (DRAM) is a volatile memory and data stored in a memory cell of a DRAM is determined by the charge stored in a capacitor of the memory cell.

A DRAM may perform internal operations by using various levels of power voltages. In addition, it is often necessary to control the power voltages in accordance with operation performance of the DRAM, such as a frequency of a signal. However, in order to control the power voltages, it is in general necessary that a plurality of switches be provided in the DRAM and that power rails for transmitting the various levels of power voltages be arranged. In this case, the size of a switch may increase in order to allow increased complexity of control of the switches or the arrangement of the power rails, and/or to reduce the voltage drop due to current passing through a resistance of the switch (IR drop).

SUMMARY

The inventive concept provides a memory device capable of improving implementation simplicity or performance by efficiently managing power voltages provided to a circuit block in a memory device, and provides a method of operating the same.

According to an aspect of the inventive concept, there is provided a memory device including a first power rail for transmitting a high power voltage, a second power rail for transmitting a low power voltage, a third power rail for selectively receiving the high power voltage from the first power rail through a first dynamic voltage and frequency scaling (DVFS) switch and for selectively receiving the low power voltage from the second power rail through a second DVFS switch, a fourth power rail connected a first power gating (PG) switch to selectively receive the high power voltage or the low power voltage from the third power rail, and a first circuit block connected to the fourth power rail to selectively receive a power voltage to which the DVFS and the power gating are applied. The first circuit block selectively receives the high power voltage or the low power voltage as the power voltage as the first PG switch is turned on, and supply of the high power voltage and the low power voltage is blocked as the first PG switch is turned off.

According to another aspect of the inventive concept, there is provided a memory device including: a power rail/control switch block having a plurality of power rails including first and second power rails to transmit power voltages used for the memory device and a plurality of switches connected to the plurality of power rails to control transmission of the power voltages, a first voltage region connected to the first power rail for selectively transmitting a high power voltage or a low power voltage as DVFS is applied, and a second voltage region connected to the second power rail for selectively transmitting the high power voltage or the low power voltage or blocking transmission of the high power voltage and the low power voltage as the DFVS and a power gating (PG) are applied. The second power rail selectively receives the high power voltage from a third power rail for transmitting the first power voltage to the second power rail by a single switching operation.

According to another aspect of the inventive concept, there is provided a memory device that operates in accordance with a low power double data rate (LPDDR) specification. The memory device includes a first power rail for transmitting a first power voltage (VDD1), a second power rail for transmitting a second high power voltage (VDD2H), a third power rail for transmitting a second low power voltage (VDD2L), a fourth power rail for selectively transmitting the second high power voltage or the second low power voltage based on an operation mode of the memory device as DVFS is applied, a fifth power rail for selectively transmitting the second high power voltage or the second low power voltage or blocking transmission of the second high power voltage and the second low power voltage as the DVFS and PG are applied, and a control switch block including a plurality of switches for controlling transmission of one or more of the power voltages between the first to fifth power rails. Based on control of the control switch block, the fifth power rail is selectively connected to the fourth power rail and is further selectively connected to at least one of the second power rail and the third power rail.

According to yet another aspect of the inventive concept, there is provided A memory device, comprising: a memory cell array; a plurality of circuit blocks for driving the memory cell array, including at least a first circuit block and a second circuit block; and a power rail and control circuit. The power rail and control circuit includes: a first power rail configured to have a first power voltage (VDD1); a second power rail configured to have a second high power voltage (VDD2H); a third power rail configured to have a second low power voltage (VDD2L); a fourth power rail configured to selectively transmit to the first circuit block a selected one of the second high power voltage and the second low power voltage based on an operation mode of the memory device as dynamic voltage and frequency scaling (DVFS) is applied to the memory device; and a fifth power rail configured to selectively transmit to the second circuit block the selected one of the second high power voltage and the second low power voltage as DVFS is applied to the memory device, and to block transmission of the selected one of the second high power voltage and the second low power voltage as power gating (PG) is applied to the device.

According to a memory device having a plurality of power rails and a method of operating the same, it is possible to improve implementation simplicity of DRAM, to reduce a size of a switch, and to reduce an IR drop by efficiently arranging control switches for switching power rails and power voltages.

BRIEF DESCRIPTION OF THE DRAWINGS

Embodiments of the inventive concept will be more clearly understood from the following detailed description taken in conjunction with the accompanying drawings.

FIGS. 4A, 4B, 5A, and 5B are views illustrating switch implementation examples in an embodiment of a memory device.

FIGS. 6A and 6B are views illustrating an example of switching a power voltage of a memory device.

DETAILED DESCRIPTION OF THE EMBODIMENTS

Figure 1:
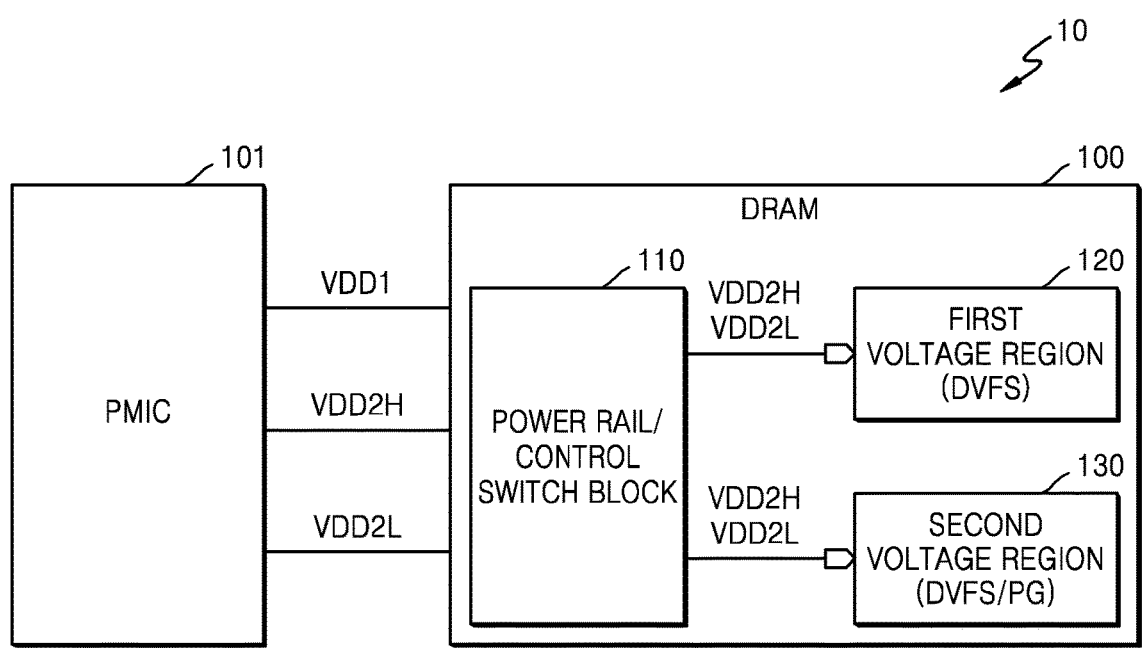
FIG. 1 is a block diagram illustrating an embodiment of a memory system.

FIG. 1 is a block diagram illustrating an embodiment of a memory system 10 including a memory device. In the following embodiments, a dynamic random access memory (DRAM) corresponding to a volatile memory is illustrated as a memory device included in memory system 10. However, embodiments are not limited thereto. For example, the memory device may be applied to another kind of volatile memory or to a non-volatile memory such as a resistive memory device or a flash memory device.

DRAM 100 may receive one or more voltages (or power voltages) from an external power management integrated circuit (PMIC) 101. DRAM 100 may be driven in accordance with one of various specifications. For example, DRAM 100 may be driven in accordance with a low power double data rate (LPDDR) specification.

DRAM 100 may receive various levels of power voltages from PMIC 101. In FIG. 1, a first power voltage VDD1, a second high power voltage VDD2H, and a second low power voltage VDD2L that are defined in the LPDDR specification are illustrated as an example. For example, the first power voltage VDD1 has the highest level, the second high power voltage VDD2H has the second highest level, and the second low power voltage VDD2L may have the lowest level. The above terms may be arbitrarily defined. For example, the voltage VDD1 having the highest level may be referred to as a second power voltage, the voltage VDD2H having the second highest level may be referred to as a first high power voltage, and the voltage VDD2L having the lowest level may be referred to as a first low power voltage.

DRAM 100 may correspond to one of various kinds of semiconductor memory devices. According to an embodiment, DRAM 100 may correspond to one of: a double data rate synchronous dynamic random access memory (DDR SDRAM), a low power double data rate (LPDDR) SDRAM, a graphics double data rate (GDDR) SDRAM, a RAMBUS® dynamic random access memory (RDRAM), and the like. In addition, DRAM 100 may perform communication in accordance with various kinds of specifications. For example, DRAM 100 may perform communication in accordance with an LPDDR specification including LPDDR5.

According to an embodiment, DRAM 100 may include a power rail/control switch block 110, a first voltage region 120, and a second voltage region 130. Although not shown in FIG. 1, DRAM 100 may include a memory cell array including a plurality of DRAM cells and a peripheral circuit including various kinds of circuit blocks for driving the memory cell array. For example, at least one circuit block in the peripheral circuit may be included in first voltage region 120 and at least one another circuit block in the peripheral circuit may be included in second voltage region 130.

According to an embodiment, various circuit blocks used for a memory operation are provided in DRAM 100 and the voltage regions may be distinguished from each other in accordance with a characteristic of a power voltage used by each circuit block. For example, first voltage region 120 may include one or more circuit blocks that selectively receive at least two power voltages as a dynamic voltage and frequency scaling (DVFS) technique is applied. For example, the circuit blocks for processing a signal by using a power voltage having a high level or a power voltage having a low level, in accordance with an operation mode of DRAM 100, may be included in first voltage region 120.

In addition, second voltage region 130 may include the circuit blocks that selectively receive at least two power voltages as the DVFS technique and a power gate technique are applied, and supply of a power voltage to second voltage region 130 may be blocked in a specific mode of DRAM 100. At this time, first voltage region 120 may be referred to as a DVFS region as the DVFS technique is applied thereto, and second voltage region 130 may be referred to as a DVFS/power gating (PG) region as the DVFS technique and the power gating technique are applied thereto. However, this is only an embodiment. Among the plurality of circuit blocks provided in DRAM 100, the kinds of the circuit blocks included in first voltage region 120 and second voltage region 130 may vary.

According to an embodiment, the circuit blocks of first voltage region 120 and second voltage region 130 may selectively receive various kinds of power voltages. For example, among the above-described power voltages defined in the LPDDR specification, first voltage region 120 may selectively receive the second high power voltage VDD2H or the second low power voltage VDD2L and may process a signal by using the selected voltage. Second voltage region 130 may selectively receive the second high power voltage VDD2H or the second low power voltage VDD2L among the above-described power voltages. However, this is only an embodiment. Various kinds of power voltages among various power voltages provided from PMIC 101 to DRAM 100 or power voltages generated by DRAM 100 may be provided to first voltage region 120 and second voltage region 130.

According to an embodiment, DRAM 100 may selectively provide the second high power voltage VDD2H having a high level or the second low power voltage VDD2L to some circuit blocks in order to control operation performance For example, when DRAM 100 enters a low power mode (or a low performance operation mode or a low speed operation mode), the second low power voltage VDD2L may be provided to first voltage region 120 and second voltage region 130. On the other hand, when DRAM 100 enters a normal power mode (or a high performance operation mode or a high speed operation mode), the second high power voltage VDD2H may be provided to first voltage region 120 and second voltage region 130.

According to an embodiment, power rail/control switch block 110 includes a plurality of power rails for transmitting the power voltages and may include switches (for example, control switches) for selectively transmitting power voltages among the plurality of power rails. For example, the plurality of power rails include a plurality of power rails for selectively transmitting the first power voltage VDD1, the second high power voltage VDD2H, and the second low power voltage VDD2L and the control switch block may include switches arranged among the plurality of power rails in order to provide power voltages to first voltage region 120 and second voltage region 130.

The switches may include one or more first switches (for example, DFVS switches) for selecting kinds of power voltages provided to first voltage region 120 and second voltage region 130, and may also include one or more second switches (for example, power gating (PG) switches) for controlling supply of a power voltage to second voltage region 130. For example, while the second high power voltage VDD2H or the second low power voltage VDD2L may be always provided to first voltage region 120, as power gating (PG) is applied to a power voltage supplied to second voltage region 130, supply of a power voltage to second voltage region 130 may be blocked.

According to an embodiment, a power voltage may be selectively transmitted between the power rails through one or more switching operations and a voltage drop due to current passing through a resistance of the switch (hereinafter referred to as an "IR drop"), in which a level of a power voltage is reduced in accordance with a switching operation, may occur. For example, when a power voltage from one power rail is transmitted to another power rail by at least two switching operations, the IR drop of the power voltage increases so that a characteristic of a level of a power voltage used by DRAM 100 may deteriorate. According to an embodiment disclosed herein, the IR drop is reduced by properly arranging the power rails and switches of power rail/control switching block 110. Therefore, it is possible to improve a characteristic of a level of a power voltage and to provide a power voltage to which a DFVS function and a PG function are applied to a voltage region (for example, second voltage region 130) including some circuit blocks.

As an example, deterioration of a characteristic, caused by an IR drop, may increase due to switching for a power voltage having a high level (for example, the second high power voltage VDD2H). According to embodiments disclosed herein, when the second high power voltage VDD2H is provided to first voltage region 120 and second voltage region 130, the second high power voltage VDD2H is provided to first voltage region 120 and second voltage region 130 through a single switching operation based on control of power rail/control switch bloc 110. Therefore, an IR drop of the second high power voltage VDD2H may be reduced so that it is possible to reduce or prevent deterioration of a characteristic of a power voltage.

Although not shown in FIG. 1, DRAM 100 may further include other voltage regions that receive a power voltage in accordance with other characteristics, for example: a voltage region that uses only the first power voltage VDD1 among the above power voltages, a voltage region that uses only the second high power voltage VDD2H, and a voltage region that uses only the second low power voltage VDD2L may be further included in DRAM 100.

Figures 2, 3:
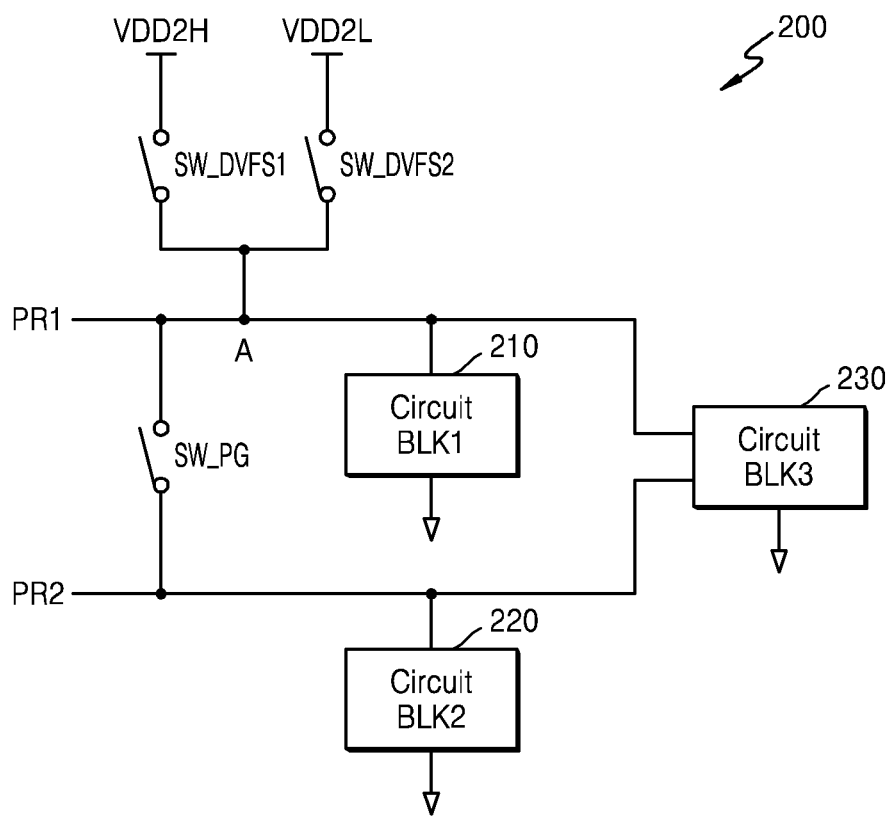
FIG. 2 is a block diagram illustrating an implementation example of an embodiment of a memory device.
FIG. 3 is a view illustrating an example of power rails arranged in a memory device.

FIG. 2 is a block diagram illustrating an implementation example of an embodiment of a memory device 200. In FIG. 2, two power rails PR1 and PR2 are illustrated. However, a larger number of power rails may be arranged in the memory device.

Referring to FIG. 2, memory device 200 includes first and second power rails PR1 and PR2 as the above-described power rail/control switch block and may include a plurality of switches connected to the first and second power rails PR1 and PR2. For example, the plurality of switches may include a first switch SW_DVFS1 for selectively transmitting the second high power voltage VDD2H and a second switch SW_DVFS2 for selectively transmitting the second low power voltage VDD2L as DVFS switches, and may further include a third switch SW_PG connected between the first power rail PR1 and the second power rail PR2 as a PG switch.

A common node A of the first power rail PR1 may selectively receive the second high power voltage VDD2H or the second low power voltage VDD2L through the first and second switches SW_DVFS1 and SW_DVFS2. On the other hand, the second power rail PR2 may selectively receive the second high power voltage VDD2H or the second low power voltage VDD2L from the common node A through the third switch SW_PG. At this time, when the third switch SW_PG is turned off, supply of a power voltage to the second power rail PR2 may be blocked.

Memory device 200 may include a plurality of circuit blocks. For example, first circuit block 210 may be connected to the first power rail PR1 and second circuit block 220 may be connected to the second power rail PR2. Circuits in first circuit block 210 may always selectively receive the second high power voltage VDD2H or the second power voltage VDD2L. On the other hand, supply of a power voltage to circuits in second circuit block 220 is blocked by opening the third switch SW_PG when memory device operates in one or more specific operating modes. For example, while information stored in first circuit bloc 210 in the specific mode may be maintained by an always-provided power voltage, information stored in second circuit block 220 may not be maintained as a power voltage is blocked from being supplied thereto in the specific mode by operation of the third switch SW_PG.

In addition, according to an embodiment, memory device 200 may further include a third circuit block 230 and third circuit block 230 may be connected to the first power rail PR1 and the second power rail PR2. Some circuits in third circuit block 230 receive a power voltage through the first power rail PR1 and some other circuits may receive a power voltage through the second power rail PR2. For example, while supply of a power voltage is maintained to some circuits connected to the first power rail PR1 in third circuit block 230, supply of a power voltage may be blocked to other circuits connected to the second power rail PR2. According to the embodiment illustrated in FIG. 2, first circuit block 210 may be included in the above-described first voltage region, and second and third circuit blocks 220 and 230 may be included in the above-described second voltage region. According to an embodiment, it may be defined that third circuit block 230 is included in a voltage region different from voltage regions of first and second circuit blocks 210 and 220.

FIG. 3 is a view illustrating an example of power rails arranged in a memory device.

The above-described various power voltages may be transmitted by various power rails in the memory device. For example, as power rails for transmitting a power voltage provided from the outside, a VDD1 power rail for transmitting the first power voltage VDD1, a VDD2H power rail for transmitting the second high power voltage VDD2H, and a VDD2L power rail for transmitting the second low power voltage VDD2L are illustrated. In addition, in FIG. 3, as power rails for transmitting a power voltage to various circuit blocks in the memory device, a VINT power rail for transmitting a first internal voltage VINT, a VPWR_INT power rail for transmitting a second internal voltage VPWR_INT, and a VPWR_2H power rail for transmitting a third internal voltage VPWR_2H are illustrated. The VINT power rail, the VPWR_INT power rail, and the VPWR_2H power rail may be referred to as internal power rails since the power rails are arranged in order to transmit power voltages to various circuit blocks internal to the memory device.

The VINT power rail transmits the first internal voltage VINT to which the above-described DVFS technique is applied. In accordance with DVFS switching, the first internal voltage VINT may correspond to the second high power voltage VDD2H or the second low power voltage VDD2L. In addition, the second internal voltage VPWR_INT corresponds to a power voltage to which the DVFS technique and the PG technique are applied and the second internal voltage VPWR_INT may correspond to the first internal voltage VINT transmitted to the VPWR_INT power rail by the PG switch (e.g., third switch SW_PG of FIG. 2).

Various circuit blocks in the memory device are connected to the VINT power rail to selectively receive the second high power voltage VDD2H or the second low power voltage VDD2L, or may be connected to the VPWR_INT power rail to selectively receive the second high power voltage VDD2H or the second low power voltage VDD2L to which PG is applied. In addition, the VPWR_2H power rail may be arranged for some circuit blocks in the memory device that exclusively use the second high power voltage VDD2H. For example, the VPWR_2H power rail may be selectively connected to the VDD2H power rail through a PG switch.

The VINT power rail may be selectively connected to the VDD2H power rail and the VDD2L power rail through the DVFS switch. In addition, the VPWR_INT power rail may be selectively connected to the VINT power rail through the PG switch. In addition, in the above-described embodiment, the circuit blocks included in the DVFS region may be connected to the VINT power rail, and the circuit hocks included in the DVFS/PG region may be connected to the VPWR_INT power rail, or may be connected to the VINT power rail and the VPWR_INT power rail.

The circuit blocks of the memory device receive power voltages through the plurality of above-described power rails and switches connected to the plurality of power rails. Some circuit blocks regularly receive only the first power voltage VDD1 and some other circuit blocks may regularly receive the second low power voltage VDD2L.

Hereinafter, an example, in which transmission of a power voltage is controlled in the memory device through various kinds of switches including a DVFS switch and a PG switch, is described. For example, in circuit implementation for transmitting a power voltage in the memory device, in order to reduce IR drop caused by the PG switch and the DVFS switch, it is necessary that the power rails and switches be efficiently arranged.

On the other hand, in the following embodiments, a stack hybrid structured switch and power rail are disclosed. For example, in a stack hybrid structure, a method of reducing an IR drop by a small switch area by properly arranging a power rail and switch based on a method of separating a high-current path and a low-current path from each other is illustrated. In addition, a plurality of circuit blocks provided in the memory device are divided into the DVFS region and the DVFS/PG region and a power rail may be efficiently arranged based on the division.

FIGS. 4A, 4B, 5A, and 5B are views illustrating switch implementation examples in an embodiment of a memory device. A configuration and operation of the memory device will be described assuming that the memory device is DRAM. In addition, a power rail for transmitting the first power voltage VDD1 is not shown for description related to a DVFS function. However, the memory device may further include a power rail for transmitting the first power voltage VDD1 and switches connected to the power rail.

Figure 4A:
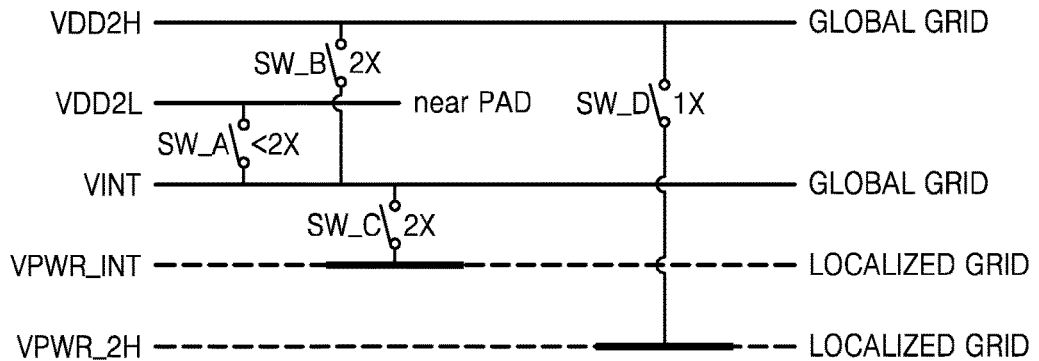

Referring to FIG. 4A, various power rails and switches connected to the power rails are illustrated. For example, the VDD2H power rail and the VINT power rail (or a power grid GRID) are globally arranged in the DRAM, and the VDD2L power rail, the VPWR_INT power rail, and the VPWR_2H power rail may be locally arranged. For example, the VDD2L power rail may be arranged to be close to a pad.

The VDD2L power rail and the VINT power rail may be selectively connected through a first switch SW_A, and the VDD2H power rail and the VINT power rail may be selectively connected through a second switch SW_B. In addition, the VINT power rail and the VPWR_INT power rail may be selectively connected through a third switch SW_C, and the VDD2H power rail and the VPWR_2H power rail may be selectively connected through a fourth switch SW_D. The above-described structure may be referred to as a two stack switch considering that a power voltage is provided to the VPWR_INT power rail through two switching devices (i.e., through the third switch SW_C, and either the first switch SW_A or the second switch SW_B).

For example, the second high power voltage VDD2H from the VDD2H power rail may be selectively provided to the VPWR_INT power rail through the VINT power rail. In addition, the second low power voltage VDD2L from the VDD2L power rail may be selectively provided to the VPWR_INT power rail through the VINT power rail. Therefore, in order to reduce the IR drop in the above-described structure, the first to third switches SW_A to SW_C may have large sizes×2, thus reducing the internal resistance of each of these switches. On the other hand, in the case of a power voltage transmitted by a single switch, a size of a switch for controlling the transmission may be small. For example, the fourth switch SW_D may have a small size×1.

Figure 4B:
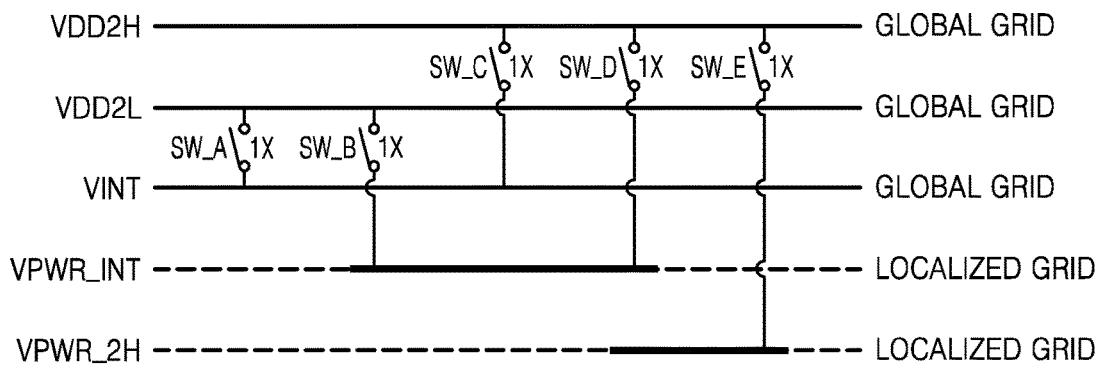

On the other hand, according to switch arrangement illustrated in FIG. 4B, in order to reduce the IR drop, a power voltage may be selectively provided from one power rail to another power rail by a single switch. For example, the VDD2L power rail and the VINT power rail are selectively connected through the first switch SW_A, and the VDD2L power rail and the VPWR_INT power rail may be selectively connected through the second switch SW_B. In addition, the VDD2H power rail and the VINT power rail are selectively connected through the third switch SW_C, the VDD2H power rail and the VPWR_INT power rail are selectively connected through the fourth switch SW_D, and the VDD2H power rail and the VPWR_2H power rail may be selectively connected through a fifth switch SW_E. In the structure illustrated in FIG. 4B, a power voltage between power rails may be transmitted through a single switch so that the IR drop may be reduced.

Like in the above-described embodiment, circuit blocks in the first voltage region and the second voltage region may receive a power voltage through one or more power rails.

For example, the circuit blocks of the first voltage region to which the DVFS technique is applied may be connected to the VINT power rail and may selectively receive the second high power voltage VDD2H or the second low power voltage VDD2L. In addition, the circuit blocks of the second voltage region to which PG is applied together with DVFS may be connected to the VPWR_INT power rail to selectively receive the second high power voltage VDD2H or the second low power voltage VDD2L. As the PG switch is turned off, supply of a power voltage may be blocked. As described above, some other circuit blocks of DRAM may be connected to the VINT power rail and the VPWR_INT power rail to receive a power voltage.

Figure 5A:
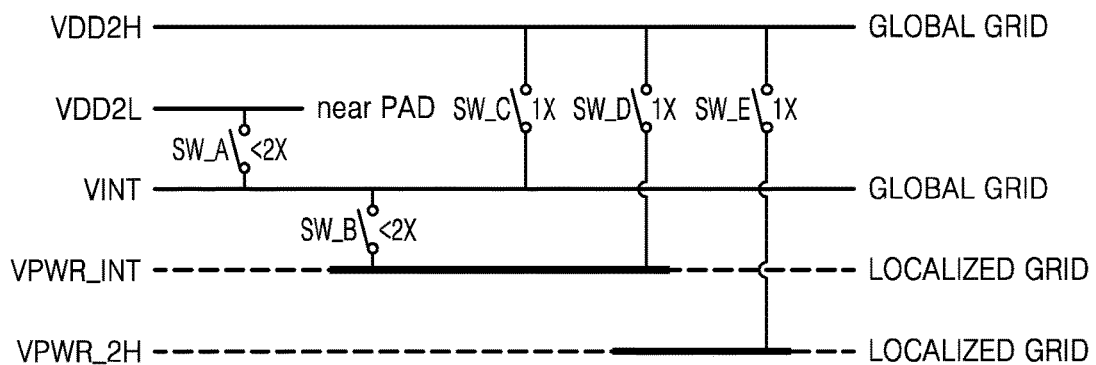

On the other hand, in FIGS. 5A and 5B, one stack and two stack hybrid structures are illustrated.

Referring to FIG. 5A, the VDD2L power rail and the VINT power rail may be selectively connected through the first switch SW_A, and the VINT power rail and the VPWR_INT power rail may be connected through the second switch SW_B. In addition, the VDD2H power rail and the VINT power rail may be selectively connected through the third switch SW_C, the VDD2H power rail and the VPWR_INT power rail may be selectively connected through the fourth switch SW_D, and the VDD2H power rail and the VPWR_2H power rail may be connected through the fifth switch SW_E.

According to the structure of FIG. 5A, the VPWR_INT power rail may be selectively connected to the VDD2H power rail through the second switch SW_B and the third switch SW_C. In addition, the VPWR_INT power rail may be selectively connected to the VDD2L power rail through the second switch SW_B and the first switch SW_A. In addition, the VPWR_INT power rail may be directly selectively connected to the VDD2H power rail through the fourth switch SW_D. Therefore, according to the embodiment illustrated in FIG. 5A, by transmitting the second high power voltage VDD2H to the VPWR_INT power rail through the fourth switch SW_D, the third switch SW_C may be smaller than the second switch SW_B of the embodiment illustrated in FIG. 4A. In addition, since it is not necessary to provide a switch of a large area in order to transmit the second high power voltage VDD2H, increase in a chip area in accordance with increase in a switch size may be reduced. In addition, in the structure illustrated in FIG. 5A, the number of global power rails (or global power grids GRID) may be reduced in comparison with the case of FIG. 4B.

FIG. 5B is a table illustrating an operation example of the switches of FIG. 5A. In the table illustrated in FIG. 5B, 0 represents a switch being off and 1 represents a switch being on. In addition, an operation marked with x illustrates don't care.

First, in a connection operation between the VDD2H power rail and the VPWR_2H power rail, in which PG is used, the states of the first switch SW_A to the fourth switch SW_D are don't care, and the fifth switch SW_E may be turned on or off to supply or block power from the VDD2H power rail to the VPWR_2H power rail.

On the other hand, in relation to application of DVFS, in the case of a connection between the VINT power rail and the VDD2L power rail, the first switch SW_A is turned on and the third switch SW_C is turned off and the remaining switches may be don't care. In addition, in the case of a connection between the VINT power rail and the VDD2H power rail, the first switch SW_A is turned off and the third switch SW_C may be turned on. The remaining switches may be in a "don't care" state.

In addition, in relation to application of the DVFS and PG, in the case of a connection between the VPWR_INT power rail and the VDD2L power rail, the first switch SW_A is turned on and the second switch SW_B may be turned on or off to supply or block power from the VDD2L power rail to the VPWR_INT power rail. The third switch SW_C and the fourth switch SW_D are turned off and the fifth switch SW_E may be don't care. In addition, in the case of a connection between VPWR_INT power rail and the VDD2H power rail, the first switch SW_A is turned off, the second switch SW_B, the third switch SW_C is turned on, the fifth switch SW_E may be don't care, and the second switch SW_B and the fourth switch SW_D are turned on or off to supply or block power from the VDD2H power rail to the VPWR_INT power rail.

In the above-described embodiment of FIG. 5A, in relation to a DVFS operation, the switches (for example, the first switch SW_A and the third switch SW_C of FIG. 5A) for transmitting the second high power voltage VDD2H and the second low power voltage VDD2L to the VINT power rail may correspond to DVFS switches. In addition, the switches (for example, the second switch SW_B, the fourth switch SW_D, and the fifth switch SW_E of FIG. 5A) for controlling transmission of a specific power voltage may correspond to PG switches.

FIGS. 6A and 6B are views illustrating an example of switching a power voltage of a memory device.

Referring to FIG. 6A, the memory device (for example, DRAM 300) may include a switch unit 310 as the above-described control switch block and a first circuit block 321 and a second circuit block 322 as one or more circuit blocks. Switch unit 310 may include a plurality of switches for DVFS and PG and each of the plurality of switches may be connected between power rails.

For example, switch unit 310 may include first and second switches SW_DVFS1 and SW_DVFS2 as the DVFS switches. The first switch SW_DVFS1 selectively provides the second high power voltage VDD2H to the VINT power rail based on a switching operation, and the second switch SW_DVFS2 may selectively provide the second low power voltage VDD2L to the VINT power rail based on a switching operation. In addition, the third switch SW_PG is connected to the VINT power rail and controls transmission of a power voltage to the VPWR_INT power rail. For example, as the third switch SW_PG is turned on, a voltage applied to the VINT power rail may be transmitted to the VPWR_INT power rail.

According to an embodiment, first circuit block 321 that receives a power voltage to which DVFS is applied is connected to the VINT power rail, and second circuit block 322 that receives a power voltage to which DVFS and PG are applied may be connected to the VPWR_INT power rail. In addition, as the first switch SW_DVFS1 and the second switch SW_DVFS2 are alternately switched, a first control signal Ctrl_DVFS1 for controlling the first switch SW_DVFS1 and a second control signal Ctrl_DVFS2 for controlling the second switch SW_DVFS2 may have the waveforms illustrated in FIG. 6B. Therefore, the second high power voltage VDD2H or the second low power voltage VDD2L may be selectively provided to the VINT power rail.

On the other hand, the third switch SW_PG is controlled by a third control signal Ctrl_PG1 and may be separately controlled from the first and second switches SW_DVFS1 and SW_DVFS2. For example, in a first period Period_A in which the second high power voltage VDD2H is switched, in a period in which the third switch SW_PG is activated (e.g., on or closed) then the second high power voltage VDD2H is provided to second circuit block 322, and in a period in which the third switch SW_PG is deactivated (e.g., off or open), supply of a power voltage to second circuit block 322 may be blocked. In addition, in a second period Period_B in which the second low power voltage VDD2L is switched, in a period in which the third switch SW_PG is activated (e.g., on or closed) then the second low power voltage VDD2L is provided to second circuit block 322, and in a period in which the third switch SW_PG is deactivated (e.g., off or open), supply of a power voltage to second circuit block 322 may be blocked.

Although not shown in FIGS. 6A and 6B, memory device 300 may further include a control circuit (not shown) for generating various control signals, including control signals for controlling the above-described switches based on various timings related to a memory operation.

Figure 7:
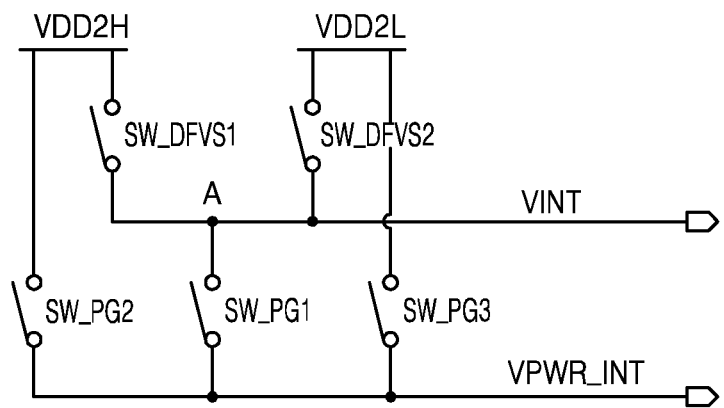
FIGS. 7 and 8 show a block diagram of a modifiable embodiment of a memory device and a waveform diagram illustrating an example of an operation of the memory device/
Figure 8:
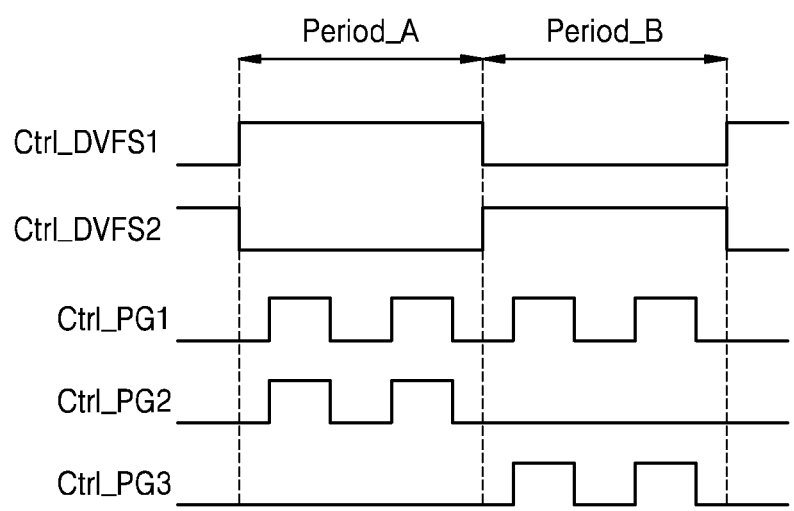

FIGS. 7 and 8 are a block diagram of a modifiable embodiment of a memory device 400 and a waveform diagram illustrating an example of an operation of the memory device.

Referring to FIG. 7, memory device 400 may include a plurality of power rails and a plurality of switches. Like in the above-described embodiment, memory device 400 may include a first switch SW_DVFS1 connected to the VDD2H power rail for transmitting the second high power voltage VDD2H and a second switch SW_DVFS2 connected to the VDD2L power rail for transmitting the second low power voltage VDD2L. Memory device 400 may further include one or more switches related to PG. For example, memory device 400 may include a third switch SW_PG1 as a PG switch connected between the VINT power rail and the VPWR_INT power rail. In FIG. 7, an example is illustrated in which memory device 400 further includes a fourth switch SW_PG2 connected between the VDD2H power rail and the VPWR_INT power rail, and a fifth switch SW_PG3 connected between the VDDD2L power rail and the VPWR_INT power rail. Although not shown in FIG. 7, memory device 400 further includes a plurality of circuit blocks and some circuit blocks are connected to the VINT power rail and some other circuit blocks may be connected to the VPWR_INT power rail.

In providing a power voltage to which DVFS and PG are applied to circuit blocks, when a power voltage is provided through the above-described DVFS switches SW_DVFS1 and SW_DVFS2 and PG switch SW_PG1, a large IR drop may occur in a power voltage applied to the VPWR_INT power. According to an embodiment described herein, together with the above-described third switch SW_PG1, an additional PG switch SW_PG2 connected between the VPWR_INT power rail and the VDD2H power rail and an additional PG switch SW_PG3 connected between the VPWR_INT power rail and the VDD2L power rail are further arranged so that the IR drop of a power voltage applied to the VPWR_INT power rail may be reduced.

For example, switching timings of the fourth and fifth switches SW_PG2 and SW_PG3 as the above-described additional PG switches may be controlled in line with the above-described DVFS switches SW_DVFS1 and SWD-VFS2 and PG switch SW_PG1. An operation example will be described as follows with reference to FIG. 8.

First, in accordance with the first and second control signals Ctrl_DVFS1 and Ctrl_DVFS2, the first switch SW_DVFS1 and the second switch SW_DVFS2 may be alternately switched. In the first period Period_A in which the second high power voltage VDD2H is provided, the first switch SW_DVFS1 is turned on and, in the second period Period_B in which the second low power voltage VDD2L is provided, the second switch SW_DVFS2 may be turned on. PG may be arbitrarily controlled. For example, in a partial period of the first period Period_A, the third switch SW_PG1 may be turned on in response to the third control signal Ctrl_PG1 and, in a partial period of the second period Period_B, the third switch SW_PG1 may be turned on in response to the third control signal Ctrl_PG1.

On the other hand, the fourth switch SW_PG2 corresponding to an additional PG switch is arranged in order to reduce the IR drop of the second high power voltage VDD2H applied to the VPWR_INT power rail. In the first period Period_A, the fourth switch SW_PG2 may be turned on or off in the same period as the third switch SW_PG1 in response to a fourth control signal Ctrl_PG2. Therefore, in the first period Period_A, the second high power voltage VDD2H may be provided to the VPWR_INT power rail through the third switch SW_PG1 and the fourth switch SW_PG2. On the other hand, in the first period Period_A, the fifth switch SW_PG3 connected to the second low power voltage VDD2L may be turned off in response to a fifth control signal Ctrl_PG3.

On the other hand, the fifth switch SW_PG3 is arranged in order to reduce the IR drop of the second low power voltage VDD2L applied to the VPWR_INT power rail. In the second period Period_B, the fifth switch SW_PG3 may be turned on or off in the same period as the third switch SW_PG1 in response to the fifth control signal Ctrl_PG3. In addition, in the second period Period_B, the fourth switch SW_PG2 connected to the second high power voltage VDD2H may be turned off. Therefore, in the second period Period_B, the second low power voltage VDD2L may be provided to the VPWR_INT power rail through the third switch SW_PG1 and the fifth switch SW_PG3.

The waveform diagram of FIG. 8 for controlling the switches is only an example. Embodiments are not limited to the example waveform diagram of FIG. 8. For example, it is not necessary for the fourth switch SW_PG2 and the fifth switch SW_PG3 to be turned on or off at the same timing as the third switch SW_PG1. A switching operation may be controlled so that the fourth switch SW_PG2 and the fifth switch SW_PG3 are turned on in at least a partial period of a period in which the third switch SW_PG1 is turned on.

On the other hand, a control operation of a power voltage in which an additional PG switch is used according to the above-described embodiment may be selectively performed in accordance with setting of memory device 400. For example, various control units such as a mode register set (MRS) and a control logic are provided in memory device 400 and an additional PG switch may be selectively used. As an operation example, during initial driving of memory device 400, a setting operation may be performed so that the additional PG switch is used or is not used based on MRS information.

Figure 9:
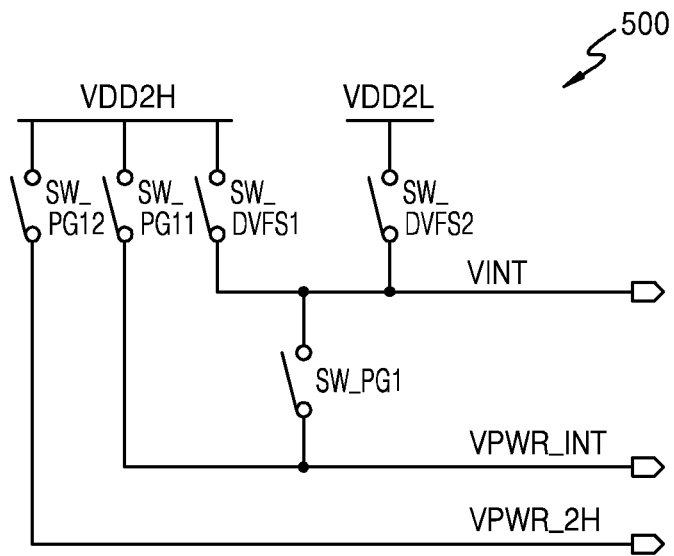
FIG. 9 is a circuit diagram illustrating an implementation example of another modifiable embodiment of a memory device.

FIG. 9 is a circuit diagram illustrating an implementation example of another modifiable embodiment of a memory device 500. In describing configuration and operation examples of the memory device illustrated in FIG. 9, a repeated description of content described above with respect to the previous embodiment will not be given.

Referring to FIG. 9, memory device 500 may include the first switch SW_DVFS1 connected to the VDD2H power rail and the second switch SW_DVFS2 connected to the VDD2L power rail as DVFS switches, and may include the third switch SW_PG1 connected between VINT power rail and the VPWR_INT power rail as a PG switch. In addition, the memory device 500 may include one or more power rails that receive the second high power voltage VDD2H transmitted by the VDD2H power rail. In FIG. 9, the VPWR_INT power rail and the VPWR_2H power rail are illustrated. According to the above-described embodiment, the VPWR_INT power rail transmits a power voltage to which DVFS and PG are applied and the VPWR_2H power rail may be connected to a circuit block that regularly receives the second high power voltage VDD2H. The VPWR_2H power rail may be connected to the VDD2H power rail through a fifth switch SW_PG12 corresponding to a PG switch.

According to an embodiment, an additional PG switch for reducing the IR drop may be applied to a power rail that receives a power voltage having a high level among a plurality of power rails. For example, in the VPWR_INT power rail that selectively receives the second high power voltage VDD2H or the second low power voltage VDD2L, a fourth switch SW_PG11 as an additional PG switch may be further arranged between the second high power voltage VDD2H and the VPWR_INT power rail. On the other hand, an additional PG switch may not be applied between the second low power voltage VDD2L and the VPWR_INT power rail.

According to an embodiment, in applying an additional PG switch for reducing the IR drop, it is possible to prevent the number of switches from excessively increasing by selectively applying the additional PG switch to the second high power voltage VDD2H having a high level. That is, it is possible to prevent an operation characteristic of the circuit block from deteriorating by preventing a power voltage in which a large IR drop occurs from being provided to circuit blocks using a power voltage having a high level.

Although not shown in FIG. 9, the additional PG switch may be further applied to a power rail for transmitting the first power voltage VDD1 having a high level among the above-described power rails. For example, when a circuit structure in which the first power voltage VDD1 is selectively transmitted from one power rail (for example, a first power rail) to another power rail (for example, a second power rail) through at least two switches (a two stack switch) exists, the additional PG switch may be connected between the first power rail and the second power rail.

Figure 10:
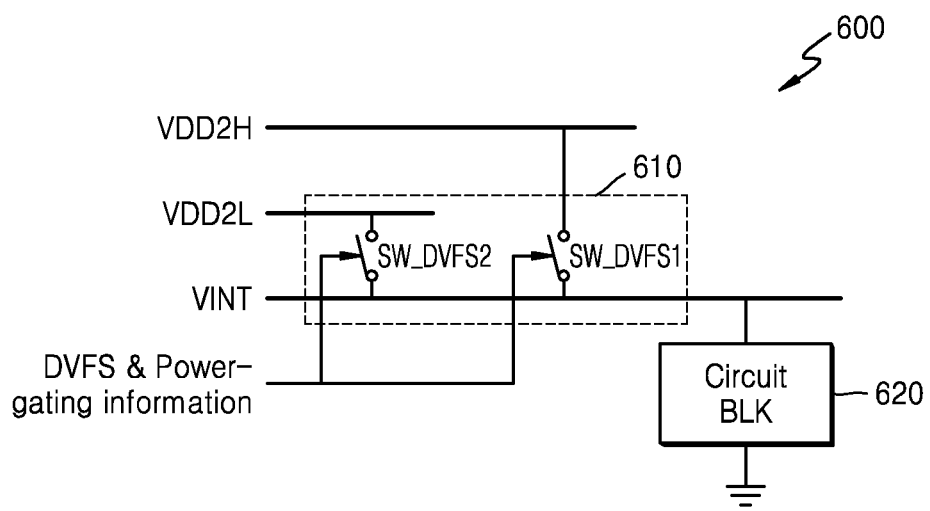
FIG. 10 is a block diagram illustrating yet another modifiable embodiment of a memory device.

FIG. 10 is a block diagram illustrating another modifiable embodiment of a memory device. In FIG. 10, an example of controlling a power voltage by using a switch that performs functions of a DVFS switch and a PG switch is illustrated. For example, in FIG. 10, in relation to a DVFS operation, the VDD2H power rail, the VDD2L power rail, and the VINT power rail are illustrated.

Referring to FIG. 10, a memory device (for example, DRAM 600) may include a switch unit 610 and a circuit block 620 and switch unit 610 may include a first switch SW_DVFS1 and a second switch SW_DVFS2 that are connected to the VINT power rail. The VDD2L power rail and the VINT power rail may be selectively connected through the first switch SW_DVFS1 and the VDD2H power rail and the VINT power rail may be selectively connected through the second switch SW_DVFS2. In addition, the first switch SW_DVFS1 and the second switch SW_DVFS2 may be controlled based on information on DVFS and information on PG. Although not shown in FIG. 10, a control circuit for generating an internal control signal by using information on DVFS and information on PG may be further provided in DRAM. The control circuit may generate a control signal for controlling the first and second switches SW_DVFS1 and SW_DVFS2 by using this information.

The information on DVFS and the information on PG may be generated by memory device 600 or a memory controller (or an application processor). According to an embodiment, one of the first switch SW_DVFS1 and the second switch SW_DVFS2 is selectively turned on based on the information on DVFS, and the high power voltage VDD2H or the second low power voltage VDD2L may be selectively provided to the VINT power rail in response thereto. In addition, in a specific mode such as a power down mode, as both the first switch SW_DVFS1 and the second switch SW_DVFS2 are turned off based on the information on PG, supply of a power voltage to a circuit block through the VINT power rail may be blocked.

According to the embodiment of FIG. 10, PG may be performed by using a DVFS switch. That is, a switch previously arranged for a DVFS function may be made to simultaneously perform a PG function in accordance with PG information. That is, it is possible to reduce or eliminate addition of one or more PG switches and to reduce the IR drop that occurs as a power voltage is transmitted through sequential switching of the DVFS switch and the PG switch.

According to the embodiment illustrated in FIG. 10, a circuit block that receives a power voltage to which DVFS and PG are applied may be connected to the VINT power rail.

Figure 11:
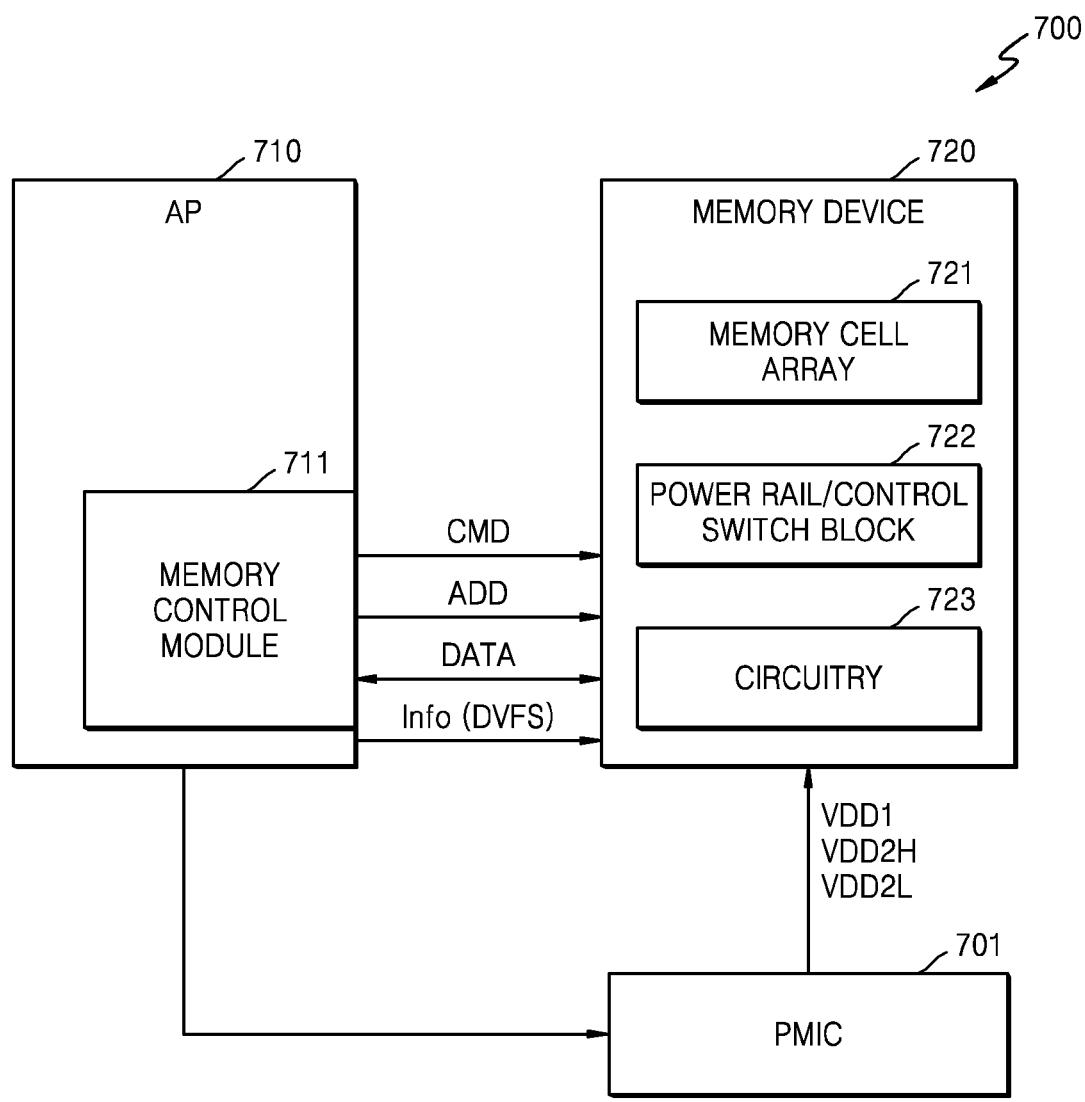
FIG. 11 is a block diagram illustrating another exemplary memory system.

FIG. 11 is a block diagram illustrating another exemplary memory system. In FIG. 11, a data processing system 700, including an application processor 710 and a memory device 720, is illustrated, and a memory control module 711 in application processor 710 and memory device 720 may configure a memory system. Memory control module 711 may provide a command CMD and an address ADD to memory device 720 and data DATA may be transmitted and received between memory control module 711 and memory device 720.

In addition, memory device 720 may include a memory cell array 721, a power rail/control switch block 722 and circuitry 723. Circuitry 723 may include a plurality of circuit blocks that receive various kinds of power voltages. Like in the above-described embodiment, as a power voltage to which DVFS is applied is provided to some circuit bocks, the second high power voltage VDD2H or the second low power voltage VDD2L may be provided to the some circuit blocks. In addition, as a power voltage to which DVFS and PG are applied is provided to some other circuit blocks, control may be performed so that supply of a power voltage to the some other circuit blocks is blocked. In addition, data processing system 700 may further include a PMIC 701 for providing the above-described various power voltages.

Application processor 710 may be implemented by a system on chip SoC. The system on chip SoC may include a system bus (not shown) to which a protocol having a predetermined standard bus specification is applied, and may include various intellectual property (IP) cores connected to the system bus. As a standard specification of the system bus, an advanced microcontroller bus architecture (AMBA) protocol of an advanced RISC machine (ARM) may be applied. A bus type of the AMBA protocol may be an advanced high-performance bus (AHB), an advanced peripheral bus (APB), an advanced extensible interface (AXI), AXI4, or AXI coherency extensions (ACE). Other than the above protocols, another type of protocol such as uNetwork of SONICs Inc, CoreConnect of IBM, or an open core protocol of OCP-IP may be applied.

Memory device 720 may perform various operations related to DVFS function according to the above-described embodiment. For example, power rail/control switch block 722 includes the VINT power rail and a common node (not shown) on the VINT power rail may be connected to the second high power voltage VDD2H or the second low power voltage VDD2L. In addition, as a PG switch is arranged between the common node and the VPWR_INT power rail and a circuit block is connected to the VPWR_INT power rail, a power voltage to which DVFS and PG are applied may be provided to the circuit block. In addition, in order to reduce or prevent deterioration of a characteristic of a power voltage in accordance with an IR drop, an additional PG switch connected to the VPWR_INT power rail may be further provided. The additional PG switch may include an additional PG switch connected to the second high power voltage VDD2H and an additional PG switch connected to the second low power voltage VDD2L.

According to an embodiment, an operation of controlling a power voltage in accordance with the DVFS and PG functions may be performed based on an operation mode of memory device 720 and an operation mode of memory device 720 may change based on control of memory control module 711. For example, memory control module 711 may provide control information Info_DVFS for controlling a power voltage in accordance with the DVFS function to memory device 720 in accordance with an operation mode and memory device 720 may perform a DVFS function or a PG function by controlling transmission of a power voltage between power rails based on the control information Info_DVFS.

Figure 12:
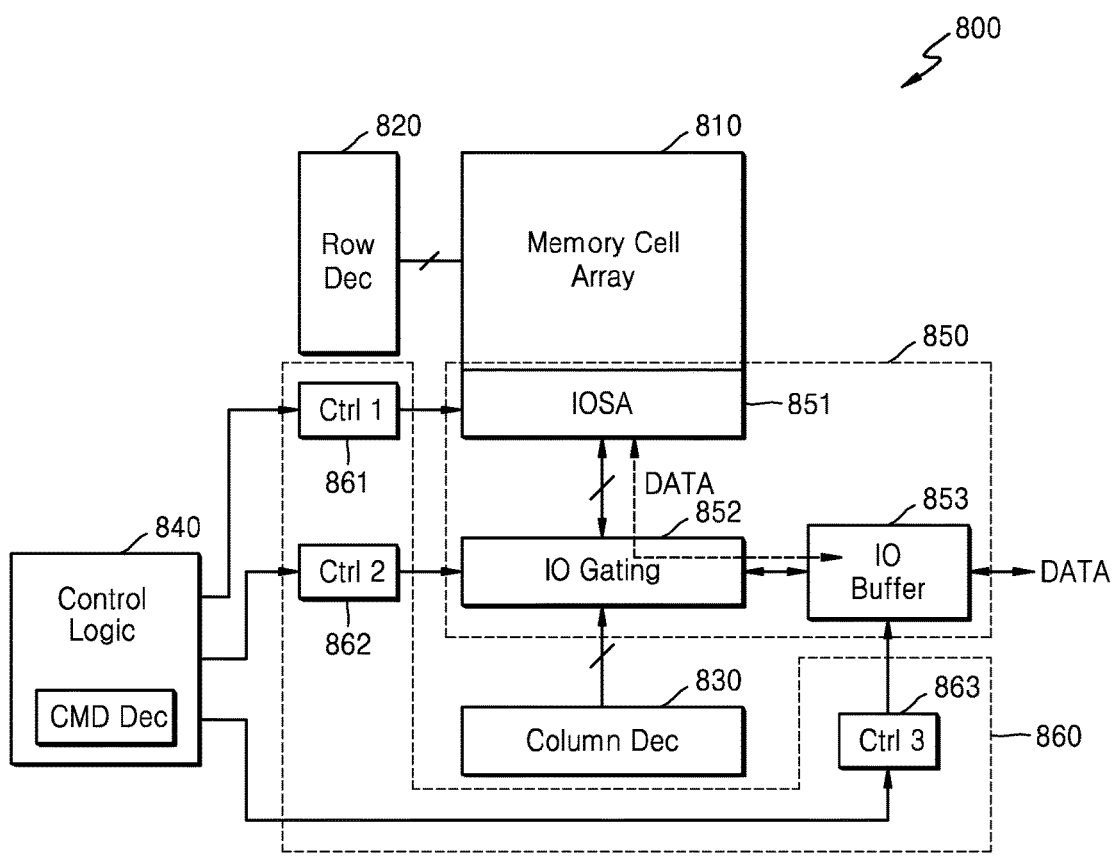
FIG. 12 is a block diagram illustrating an implementation example of another embodiment of a memory device.

FIG. 12 is a block diagram illustrating an implementation example of another embodiment of a memory device 800. In FIG. 12, an example in which a power voltage is provided to various circuit blocks in memory device 800 based on operations of power rails and a switch according to the above-described embodiments is illustrated.

Referring to FIG. 12, memory device 800 may include a memory cell array 810, a row decoder 820, a column decoder 830, and control logic 840. In addition, memory device 800 may further include a first voltage region 850 and a second voltage region 860. First voltage region 850 corresponds to a data path region (or a DVFS region) and may include one or more data processing blocks. In addition, second voltage region 860 may include one or more control blocks for controlling the data path region. For example, first voltage region 850 may include an input and output sense amplifier 851 for amplifying data, an input and output gating circuit 852 for gating data in accordance with a column decoding result, and an input and output buffer 853 for transmitting data to and receiving data from the outside. In addition, second voltage region 860 may include control blocks for controlling data processing blocks of first voltage region 850. For example, first to third control blocks 861 to 863 are illustrated.

Memory cell array 810 may include memory cells connected to a plurality of word lines and a plurality of bit lines. Row decoder 820 may select the word lines in response to a row address from the outside. In addition, column decoder 830 may select the bit lines in response to a column address from the outside. During a data recording or storing (writing) operation, based on selecting operations of row decoder 820 and column decoder 830, record data DATA may be provided to a selecting memory cell of memory cell array 810. In addition, during a data reading operation, based on the selecting operations of row decoder 820 and column decoder 830, read data DATA read from memory cell array 810 may be provided to the outside of memory device 800.

Control logic 840 may control an entire operation in memory device 800. For example, control logic 840 may include a command decoder, and various circuit blocks in memory device 800 may be controlled in response to a command from a memory controller. For example, control logic 840 may control first to third control blocks 861 through 863 of second voltage region 860, and first to third control blocks 861 through 863 may control data processing blocks in first voltage region 850 based on control of control logic 840. For example, during a data recording or storing (writing) operation, based on control of first to third control blocks 861 through 863, the record data DATA may be provided to memory cell array 810 through input and output buffer 853, input and output gating circuit 852, and input and output sense amplifier 851. In addition, during a data reading operation, based on control of first to third control blocks 861 to 863, the read data DATA may be provided to the outside through input and output sense amplifier 851, input and output gating circuit 852, and input and output buffer 853.

Although not shown in FIG. 12, the plurality of power rails and switches in the above-described embodiment may be provided in memory device 800. Based on operations of the switches, a power voltage provided to first voltage region 850 and second voltage region 860 may be controlled. For example, as first voltage region 850 corresponds to the DVFS region or the DVFS/PG region in the above-described embodiment, the second high power voltage VDD2H or the second low power voltage VDD2L may be provided to first voltage region 850. In addition, according to the above-described embodiments, a power voltage in which the IR drop is reduced may be provided to first voltage region 850. In addition, as PG is applied, supply of a power voltage to first voltage region 850 may be blocked.

On the other hand, second voltage region 860 may correspond to a voltage region that regularly receives the second high power voltage VDD2H. In the above described embodiment, a power voltage transmitted through the VPWR_2H power rail may be provided to circuit blocks in second voltage region 860. For example, the VPWR_2H power rail may selectively receive the second high power voltage VDD2H and may transmit the second high power voltage VDD2H by a single switching operation. Therefore, the IR drop of the second high power voltage VDD2H may be reduced.

In FIG. 12, it is illustrated that first to third control blocks 861 to 863 for controlling the data processing blocks are included in second voltage region 860. However, it is not necessary for embodiments to be limited thereto. Other various kinds of circuit blocks in memory device 800 may be included in second voltage region 860. For example, memory cell array 810, row decoder 820, and column decoder 830 may be included in second voltage region 860. In addition, control logic 840 may be also included in second voltage region 360.

According to an implementation example, first voltage region 850 and second voltage region 860 may be functionally and physically separated from each other, for example by being formed in different wells in a semiconductor substrate. That is, in accordance with a function of a circuit block, as described above, voltage regions may be defined and may be physically separated from first voltage region 850 and second voltage region 860. As described above, as regions are separated, circuit blocks included in the same voltage region may be adjacent to each other (or are formed in the same well in a semiconductor substrate). Therefore, power rails may be properly arranged to correspond to the respective voltage regions.

While the inventive concept has been particularly shown and described with reference to embodiments thereof, it will be understood that various changes in form and details may be made therein without departing from the spirit and scope of the following claims.

What is claimed is:

1. A memory device, comprising:
a first power rail for transmitting a high power voltage;
a second power rail for transmitting a low power voltage;
a third power rail for selectively receiving the high power voltage from the first power rail through a first dynamic voltage and frequency scaling (DVFS) switch, and for selectively receiving the low power voltage from the second power rail through a second DVFS switch;
a fourth power rail connected through a first power gating (PG) switch to selectively receive the high power voltage or the low power voltage from the third power rail; and
a first circuit block connected to the fourth power rail to selectively receive a power voltage to which the DVFS and the power gating are applied,
wherein the first circuit block selectively receives the high power voltage or the low power voltage as the power voltage as the first PG switch is turned on, and wherein supply of the high power voltage and the low power voltage to the first circuit block is blocked as the first PG switch is turned off.

2. The memory device of claim 1, further comprising a second circuit block connected to the third power rail to regularly receive the high power voltage or the low power voltage.

3. The memory device of claim 2, further comprising a third circuit block connected to the third power rail and the fourth power rail,
wherein some circuits in the third circuit block are connected to the third power rail, and
wherein some other circuits in the third circuit block are connected to the fourth power rail.

4. The memory device of claim 1,
wherein the high power voltage is a VDD2H voltage defined in a low power double data rate 5(LPDDR5) specification, and
wherein the low power voltage is a VDD2L voltage defined in the LPDDR5 specification.

5. The memory device of claim 1, further comprising:
a second PG switch connected between the first power rail and the fourth power rail; and
a third PG switch connected between the second power rail and the fourth power rail.

6. The memory device of claim 5,
wherein the first DVFS switch is turned on in a first period in which the high power voltage is provided to the third power rail and the second DVFS switch is turned on in a second period in which the low power voltage is provided to the third power rail, and
wherein the first PG switch is turned on in at least a partial period in each of the first period and the second period.

7. The memory device of claim 6,
wherein the second PG switch is turned on together with the first PG switch in the first period, and
wherein the third PG switch is turned on together with the first PG switch in the second period.

8. The memory device of claim 1, further comprising:
a fifth power rail for regularly transmitting the high power voltage;
a second PG switch connected between the first power rail and the fourth power rail; and
a third PG switch connected between the first power rail and the fifth power rail,
wherein the high power voltage is selectively provided to the fourth power rail and the fifth power rail through a single switching operation.

9. The memory device of claim 8, further comprising:
a first voltage region including one or more data processing blocks for transmitting data to be stored in a memory cell array or read from the memory cell array; and
a second voltage region including one or more control blocks for controlling the data processing blocks,
wherein the first voltage region is connected to the third power rail or the fourth power rail to receive the power voltage to which DVFS is applied, and wherein the second voltage region is connected to the fifth power rail to regularly receive the high power voltage.

10. A memory device, comprising:
a power rail/control switch block having a plurality of power rails, including first and second power rails to transmit power voltages used for the memory device, and a plurality of switches connected to the plurality of power rails to control transmission of the power voltages;
a first voltage region connected to the first power rail for selectively transmitting a high power voltage or a low power voltage as dynamic voltage and frequency scaling (DVFS) is applied; and
a second voltage region connected to the second power rail for selectively transmitting the high power voltage or the low power voltage or blocking transmission of the high power voltage and the low power voltage as the DFVS and a power gating (PG) are applied,
wherein the second power rail selectively receives the high power voltage from a third power rail for selectively transmitting the high power voltage to the second power rail by a single switching operation,
wherein the high power voltage is a VDD2H voltage defined in a LPDDR 5 specification, and
wherein the low power voltage is a VDD2L voltage defined in the LPDDR5 specification.

11. The memory device of claim 10, wherein the power rail/control switch block comprises:
a first DVFS switch connected between the third power rail and the first power rail;
a second DVFS switch connected between the first power rail and a fourth power rail for selectively transmitting the low power voltage from the first power rail to the fourth power rail;
a first power gating (PG) switch connected between the first power rail and the second power rail; and
a second PG switch connected between the third power rail and the second power rail,
wherein, as the second PG switch is turned on, the high power voltage is transmitted from the third power rail to the second power rail by the single switching operation.

12. The memory device of claim 11, wherein, as the first PG switch and the second PG switch are turned on, the high power voltage is transmitted to the second power rail through the first PG switch and the second PG switch.

13. The memory device of claim 11, wherein the power rail/control switch block further comprises a third PG switch connected between the fourth power rail and the second power rail.

14. The memory device of claim 13,
wherein the first DVFS switch and the second DVFS switch are alternately turned on, and wherein the first PG switch is turned on at timing irrelevant to timing of switching operations for the first and second DVFS switches.

15. The memory device of claim 14,
wherein the second PG switch is turned on together with the first PG switch in a first period in which the first DVFS switch is turned on, and
wherein the third PG switch is turned on together with the first PG switch in a second period in which the second DVFS switch is turned on.

16. A memory device that operates in accordance with a low power double data rate (LPDDR) specification, the memory device comprising:
   a first power rail for transmitting a first power voltage (VDD1);
   a second power rail for transmitting a second high power voltage (VDD2H);
   a third power rail for transmitting a second low power voltage (VDD2L);
   a fourth power rail for selectively transmitting the second high power voltage or the second low power voltage based on an operation mode of the memory device as dynamic voltage and frequency scaling (DVFS) is applied;
   a fifth power rail for selectively transmitting the second high power voltage or the second low power voltage or blocking transmission of the second high power voltage and second low power voltage as the DVFS and PG are applied; and
   a control switch block including a plurality of switches for controlling transmission of one or more of the power voltages between the first to fifth power rails,
wherein, based on control of the control switch block, the fifth power rail is selectively connected to the fourth power rail and is further selectively connected to at least one of the second power rail and the third power rail.

17. The memory device of claim 16,
wherein the memory device receives the first power voltage, the second high power voltage, and the second low power voltage from an external power management integrated circuit, and
wherein the first power voltage has a higher voltage level than the second high power voltage and the second high power voltage has a higher voltage level than the second low power voltage.

18. The memory device of claim 16, wherein the control switch block comprises:
   a first DVFS switch connected between the second power rail and the fourth power rail;
   a second DVFS switch connected between the third power rail and the fourth power rail;
   a first PG switch connected between the fourth power rail and the fifth power rail; and
   a second PG switch connected between the second power rail and the fifth power rail.

19. The memory device of claim 18, further comprising a third PG switch connected between the third power rail and the fifth power rail.

* * * * *